(12) United States Patent
Furumoto et al.

(10) Patent No.: US 6,257,480 B1
(45) Date of Patent: Jul. 10, 2001

(54) JET SOLDERING METHOD AND APPARATUS

(75) Inventors: Atushi Furumoto; Ataru Ichikawa, both of Kariya; Tatsuya Kubo, Ogaki; Misao Tanaka, Takahama; Mitsuhiro Sugiura; Kenji Arai, both of Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/340,716

(22) Filed: Jun. 29, 1999

(30) Foreign Application Priority Data

Jul. 7, 1998 (JP) .................................................. 10-191573
Nov. 17, 1998 (JP) .................................................. 10-326608
Dec. 16, 1998 (JP) .................................................. 10-357706

(51) Int. Cl.⁷ ............................. B23K 31/00; B23K 1/06; B23K 5/20; B23K 37/00; B23K 1/00
(52) U.S. Cl. ..................... 228/125; 228/1.1; 228/19; 228/21; 228/37; 228/110.1; 228/111.5; 228/208
(58) Field of Search ...................... 228/125, 110.1, 228/111.5, 208, 1.1, 19, 21, 37

(56) References Cited

U.S. PATENT DOCUMENTS

| | | | | |
|---|---|---|---|---|
| 3,966,110 | * | 6/1976 | Boynton | 228/175 |
| 3,973,322 | * | 8/1976 | Boynton | 29/837 |
| 4,239,812 | * | 12/1980 | Boynton | 427/96 |
| 4,246,865 | * | 1/1981 | Shimada et al. | 118/65 |
| 4,269,870 | * | 5/1981 | Boynton | 427/96 |
| 4,401,253 | * | 8/1983 | O'Rourke | 228/125 |
| 4,402,448 | * | 9/1983 | O'Rourke | 228/125 |
| 4,410,126 | * | 10/1983 | O'Rourke | 228/180 |
| 4,566,624 | * | 1/1986 | Comerford | 228/180.1 |
| 4,709,846 | * | 12/1987 | Eidenberg | 228/34 |
| 5,162,082 | * | 11/1992 | Elliott | 228/176 |
| 5,193,734 | * | 3/1993 | Takayama et al. | 228/37 |
| 5,370,297 | * | 12/1994 | Ciniglio et al. | 228/40 |
| 5,379,931 | * | 1/1995 | Van Schaik | 228/37 |
| 5,725,143 | * | 3/1998 | Leturmy | 228/37 |
| 5,762,257 | * | 6/1998 | Garrecht | 228/56.2 |

FOREIGN PATENT DOCUMENTS

| | | |
|---|---|---|
| 59-209474 | 11/1984 | (JP) . |
| 63-193595 | 8/1988 | (JP) . |
| 64-35986 | 2/1989 | (JP) . |
| 1-231396 | 9/1989 | (JP) . |

* cited by examiner

Primary Examiner—Patrick Ryan
Assistant Examiner—Zidia T. Pittman
(74) Attorney, Agent, or Firm—Pillsbury Winthrop LLP

(57) ABSTRACT

In a jet soldering method, a substrate is held by an actuator and pre-heated by a pre-heater. The pre-heater has a shield member or the substrate is swung to equalize temperature distribution in the substrate. The substrate is then transferred over a primary jet soldering bath while dipping a treatment surface of the substrate in a primary solder jet, so that solder stick to the treatment surface of the substrate. Then, the substrate is transferred over a secondary jet soldering bath while dipping the treatment surface in a secondary solder jet, so that the solder sticking to the substrate is shaped. The transfer conditions of the substrate are differentiated between transfers over the primary jet soldering bath and the secondary jet soldering bath.

30 Claims, 12 Drawing Sheets

JET SOLDERING METHOD AND APPARATUS

CROSS REFERENCE TO RELATED APPLICATION

This application relates to and incorporates herein by reference Japanese Patent Applications No. 10-191573, No. 10-326608 and 10-357707 filed on Jul. 7, 1998, Nov. 17, 1998 and Dec. 16, 1998, respectively.

BACKGROUND OF THE INVENTION

1. Field of the Invention

The present invention relates to a jet or flow soldering method and apparatus for soldering electronic circuit parts onto a printed circuit board.

2. Description of Related Art

In a jet (flow) soldering method, as shown in FIG. 18, a printed circuit board (substrate) 5 is transferred by a conveyer 94 to stick solder onto a bottom surface (treatment surface) of the substrate 5. Specifically, the substrate 5 is transferred over a pre-heater 7, a primary jet (flow) soldering bath 2 and 20 a secondary jet (flow) soldering bath 3 sequentially at a fixed speed by the conveyer 94.

Thus, the substrate 5 is heated at above the pre-heater 7, so that a temperature difference between the top surface and the bottom surface of the substrate 5, which will occur at the time of soldering, is reduced to prevent warping of the substrate 5. Then, the solder stick onto the treatment surface of the substrate 5 to solder electronic circuit parts to the treatment surface by transferring the substrate 5 over the primary jet soldering bath 2 with the treatment surface of the substrate 5 being immersed in a primary solder jet 21, that is, contacted to the primary solder jet 21. Thereafter, the solder sticking onto the substrate 5 is shaped by transferring the substrate 5 over the secondary jet soldering bath 3 with the treatment surface being immersed in a secondary solder jet 31.

Here, as shown in FIG. 19A, the solder stick onto the treatment surface 51 of the substrate 5 by waving the primary solder jet 21 in the primary jet soldering bath 2. In a case that space 57 between electrode terminals of electronic circuit parts 59 on the substrate 5 is comparatively large as shown in FIG. 19A, the solder is enabled to enter and stick to lands 58 by waving the primary solder jet 21. However, the magnitude of wave is limited because of its dependency on the viscosity, the surface tension and the like of solder. As a result, in a case that the space 57 between the electronic circuit parts 59 on the substrate 5 is small as shown in FIG. 19B, the solder is disabled to enter the space. Thus, defect of imperfect soldering increases, as the substrate 5 is integrated highly recently, that is, as the circuit parts 59 are located more closely.

Further, the temperature distribution in the substrate 5 is likely to become non-uniform because of influence of non-uniformity of temperature in the upper surface (heat radiation surface) of the pre-heater 7. This causes warping of the substrate 5, and damage to the electronic circuit parts 59 when heated excessively. The pre-heated temperature varies from substrate to substrate. The pre-heating condition is determined only by the temperature, resulting in an impediment to equalization of the pre-heated temperature among the substrates.

SUMMARY OF THE INVENTION

It is therefore an object of the present invention to provide a jet soldering method and apparatus, which enables the solder to enter small space so that imperfect soldering and deformation of solder is reduced.

It is a further object of the present invention to provide a jet soldering method and apparatus, which is capable of stabilizing pre-heating prior to soldering.

According one aspect of the present invention, a transfer condition between a transfer of a substrate over a primary jet soldering bath and a transfer over a secondary jet soldering bath is differentiated from each other. Preferably, the substrate is transferred over the primary jet soldering bath at a high speed and over the secondary jet soldering bath at a low speed. Preferably, an elevation angle of inclination of the substrate in upward and downward directions relative to the substrate transfer direction is set smaller over the primary jet soldering bath than over the secondary jet soldering bath. Preferably, a dipping depth of the solder into the solder jet is set larger in the primary solder jet than in the secondary solder jet. Preferably, a horizontal angle of inclination of the substrate in the horizontal direction relative to the transfer direction is set smaller over the primary jet soldering bath than over the secondary jet soldering bath.

According to another aspect of the present invention, a shielding member is provided around a heat radiation surface of a pre-heater to be higher than the heat radiation surface, a substrate mounted with electronic circuit parts is positioned above the heat radiation surface of the pre-heater, and the substrate is immersed in or contacted to the solder jet after holding the position of the substrate for a predetermined time period. The shield member around the pre-heater restricts the heat radiation surface of the pre-heater from cooling down so that lowering of the surface temperature within the heat radiation surface of the pre-heater is restricted to efficiently heat the substrate to equalize temperature distribution in the substrate. Alternatively, the substrate may be swung above the heat radiation surface of the pre-heater to equalize the temperature distribution in the substrate without using the shield member.

BRIEF DESCRIPTION OF THE DRAWINGS

Other objects, features and advantages of the present invention will become more apparent from the following detailed description made with reference to the accompanying drawings. In the drawings.

DETAILED DESCRIPTION OF THE PREFERRED EMBODIMENT

Figure 1:
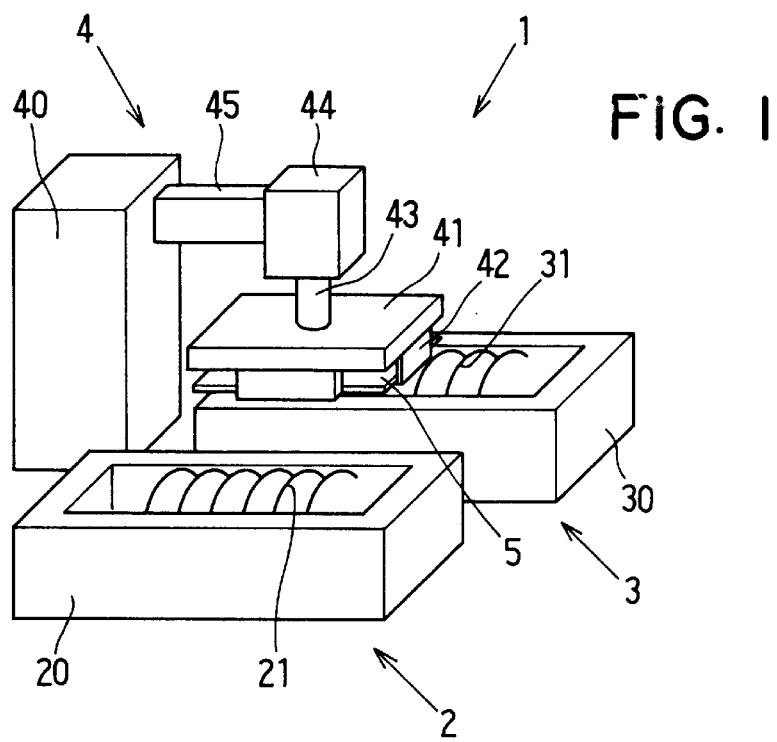
FIG. 1 is a perspective view showing a jet soldering apparatus according to a first embodiment of the present invention.

The present invention is described more fully hereunder with reference to various embodiments, throughout which the same reference numerals designate the same or similar parts of an apparatus.

(First Embodiment)

A jet soldering apparatus designated by numeral 1 in FIG. 1 has a primary jet soldering bath 2 for sticking solder onto a bottom surface (treatment surface) 51 of a printed circuit board (substrate) 5, and a secondary jet soldering bath 3 for shaping the solder sticking to the substrate 5. The jet soldering apparatus 1 further has a pre-heater (not shown) and an actuator 4, which transfers the substrate 5 over the pre-heater, the primary jet soldering bath 2 and the secondary soldering bath 3 while dipping the treatment surface 51 in a primary solder jet 21 and a secondary solder jet 31.

Figure 2:
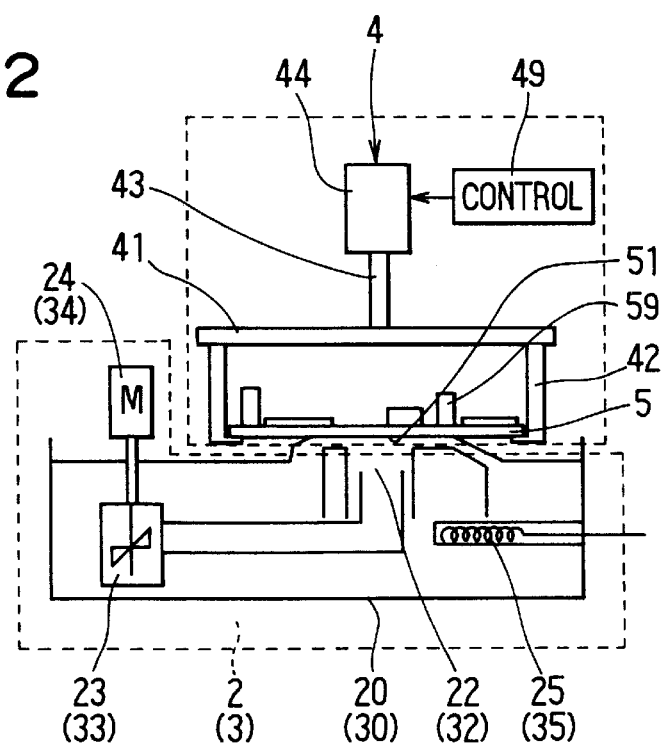
FIG. 2 is a schematic view showing the jet soldering apparatus according to the first embodiment.

The primary jet soldering bath 2 and the secondary jet soldering bath 3 have, as shown in FIG. 2, baths 20 and 30 for storing solders, heaters 25 and 35 for melting the solders therein, nozzles 22 and 32 for jetting the solder in the upward direction, jetting pumps 23 and 33 and jetting motors 24 and 34, respectively. The nozzle 22 of the primary jet soldering bath 2 is shaped to wave the primary solder jet 21 greatly, so that the wave of the solder may reach even small spaces on the treatment surface 51 of the substrate 5. On the contrary, the nozzle 32 of the secondary jet soldering bath 3 is shaped to wave the secondary solder jet 31 less.

Further, the actuator 4 is a robot having a hand 41 and a chuck mechanism 42. The chuck mechanism 42 has chucks 42a and 42b for gripping the substrate 5. The actuator 4 is so constructed, as shown in FIG. 3, that its hand 41 is rotatable in the horizontal direction and movable in the frontward, rearward, leftward, rightward, upward and downward directions.

Here, in FIG. 2, numeral 49 indicates a controller which produces operation instruction signals to the actuator 4.

Figure 3:
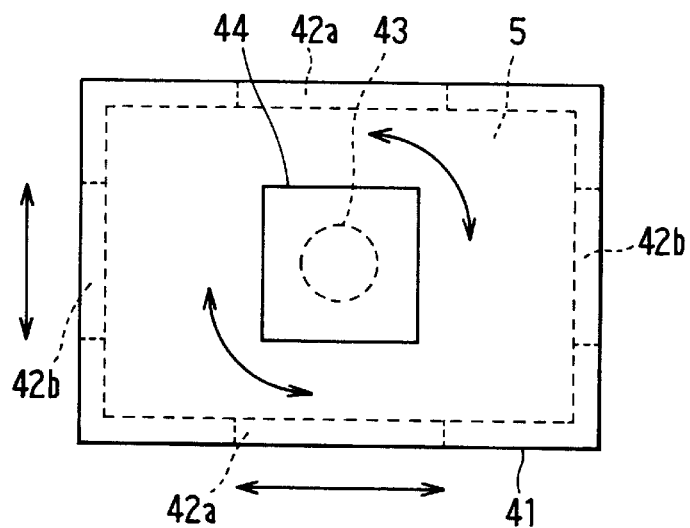
FIG. 3 is a schematic plan view showing operation of a hand of an actuator used in the first embodiment.

Further, in FIGS. 1 to 3, numeral 40 indicates an actuator body, numerals 43 and 44 indicate upper and lower driving shafts, and numeral 45 indicates an arm.

The soldering is effected in the following manner by the use of the above jet soldering apparatus 1.

That is, the substrate 5 is gripped by the chuck 42a or 42b provided on the hand 41 of the actuator 4, and moved to above the pre-heater. After the pre-heating by the pre-heater, it is transferred over the primary jet soldering bath 2 with the treatment surface 51 of the substrate 5 being immersed in the primary solder jet 21, that is, being contacted with the wave of the solder jet 21. The transfer speed over the primary soldering bath 2 is preferably between 10–15 meters per minute, particularly in case that the substrate transfer speed over the primary soldering bath 2 is far higher than that over the secondary jet soldering bath 3. It is of course possible to transfer the substrate at a speed less than 10 m/min, while enabling the solder to enter the space on the treatment surface 51. Thus, the solder stick to the treatment surface 51 of the substrate 5.

Here, the chucks 42a and 42b of the hand 41 are used selectively depending on the transfer direction of the substrate 5. That is, only one chuck 42a or 42b which is located at the front and rear sides relative to the transfer direction is used.

Therefore, as described with reference to a second embodiment, the mode of gripping is changed in a case that the treatment surface 51 of the substrate 5 is immersed in the primary solder jet 21 from different directions. For instance, the substrate 5 is gripped by the chuck 42b at the time of the first dipping and the second dipping, and is gripped by the chuck 42a after changing the direction of the substrate 5 by an angle of 90°.

Next, the substrate 5 is transferred to the secondary jet soldering bath 3. The solder sticking to the treatment surface 51 is solidified. Then, the substrate 5 is transferred over the secondary jet soldering bath 3 with its treatment surface 51 being immersed in the secondary solder jet 31. The transfer speed is preferably about several meters per minute, for instance, 1.4 m/min. Thus, the solder once solidified on the treatment surface is melted by the secondary jet solder 31 is shaped by slowly raising the substrate 5 from the secondary solder jet 31. That is, the solder sticking to the treatment surface 51 excessively in the primary jet soldering bath 2 is eliminated in the secondary jet soldering operation. The transfer speed of the substrate 5 is differentiated at above the primary jet soldering bath 2 and the secondary jet soldering bath 3. Specifically, the substrate 5 is transferred over the secondary jet soldering bath 3 at a speed lower than that of transfer over the primary jet soldering bath 2 for a good solder shaping.

This transfer pattern is determined based on the viscosity of solder, the shape or size of substrate 5 and the like. The actuator 4 is driven by transmitting the operation instruction signal from the controller 49.

Figure 4:
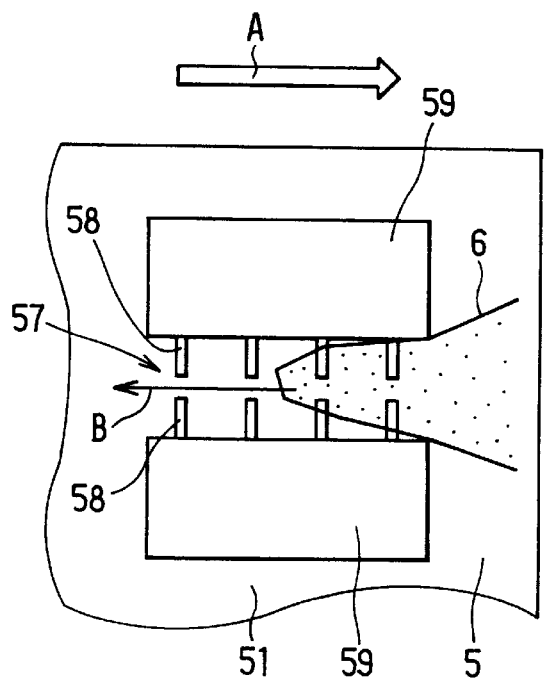
FIG. 4 is a schematic view showing a movement of solder into space among electronic circuit parts on a substrate in the first embodiment.

In the jet soldering operation according to the present embodiment, the substrate 5 is transferred (arrow A in FIG. 4) over the primary jet soldering bath 2 at a comparatively high speed. Thus, as shown in FIG. 4, the inertial force (arrow B in FIG. 4) of the solder 6 to be sticking to the substrate 5 is increased and the solder 6 enters into a narrow space 57 provided between circuit parts 59. Thus, the solder 6 stick to lands 58 of the circuit parts 59 existing in the space 57. Therefore, incomplete soldering does not occur on the substrate 5, even if circuit parts 59 are arranged highly densely on the substrate 5.

On the contrary, the substrate 5 is transferred over the secondary jet soldering bath 3 at a speed lower than the transfer speed at above the primary jet soldering bath 2. As a result, the solder 6 can be shaped assuredly because it is less likely that the unsolidified solder sticking to the substrate 5 deforms. Further, for this reason, it is less likely that the imperfect bridging occurs.

Further, as the actuator 4 is capable of changing its operation pattern freely, the operation can be matched even when the viscosity of the solder 6, shape of the substrate 5 and the like change so that an appropriate soldering may be effected.

(Second Embodiment)

Figure 5:
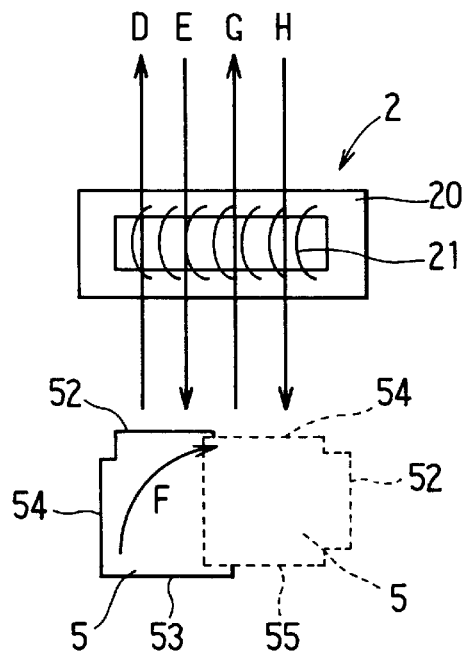
FIG. 5 is a schematic view showing a primary jet soldering operation according to a second embodiment of the present invention.

In this embodiment, as shown in FIG. 5, the treatment surface 51 of the substrate 5 is immersed in the primary solder jet 21 from four different directions on the same generally horizontal plane.

That is, the substrate 5 is transferred (arrow D in FIG. 5) to be immersed in the primary soldering jet 21, while holding its front side end 52 at a head. Next, the substrate 5 is transferred in a direction (arrow E in FIG. 5) opposite to that of the first dipping and immersed in the primary soldering jet 21, while holding its rear side end 53 at the head without rotating.

Then, the substrate 5 is turned 90° (arrow F in FIG. 5) by rotating the hand 41 of the actuator 4. The substrate 5 is transferred (arrow G in FIG. 5) to be immersed in the primary solder jet 21, while holding its left side end 54 at the head. Then, the substrate 5 is transferred in a direction (arrow H in FIG. 5) opposite to that of the third dipping and immersed in the primary solder jet 21, while holding its right side end 55 at the head without rotating.

Figure 6:
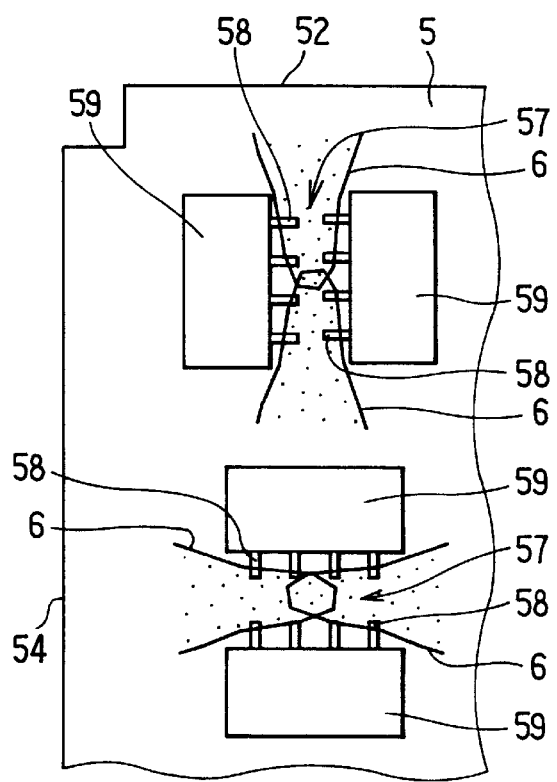
FIG. 6 is a schematic view showing a movement of solder into space among electronic circuit parts on a substrate in the second embodiment.

Thus, as shown in FIG. 6, the solder 6 efficiently enters the narrow spaces 57 formed in various directions between the plural circuit parts 59 on the substrate 5. As a result, the solder 6 sticks to the lands 58 existing in the spaces 57. Therefore, the defects of unsoldering on the substrate 5 on which the circuit parts 59 are arranged in high density can be reduced further. Further, as the actuator 4 is a robot, the substrate 5 can be immersed in the primary solder jet 21 from the four different directions as described above.

Further, the same operation and advantage of the first embodiment is provided by differentiating the transfer speeds over the first jet soldering bath 2 and the second jet soldering bath 3 in the same manner as in the first embodiment.

(Third Embodiment)

Figure 7:
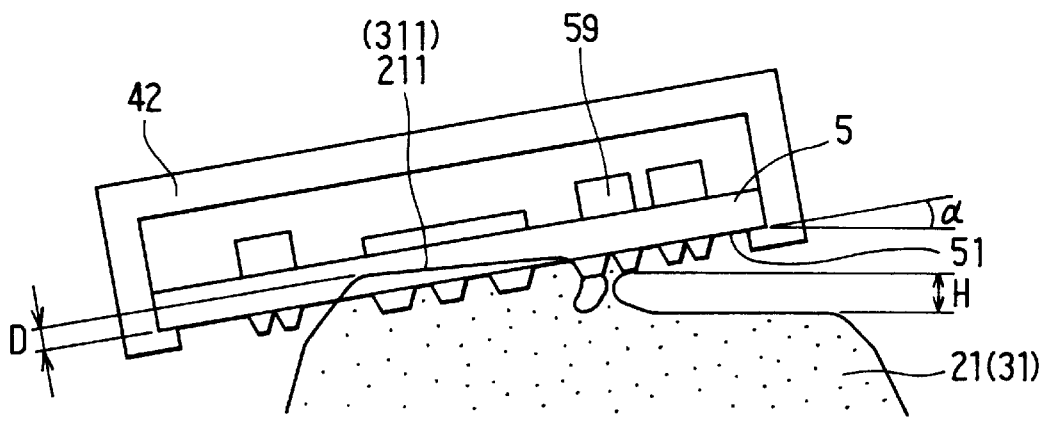
FIG. 7 is a schematic view showing a jet soldering operation according to a third embodiment of the present invention.
Figure 8:
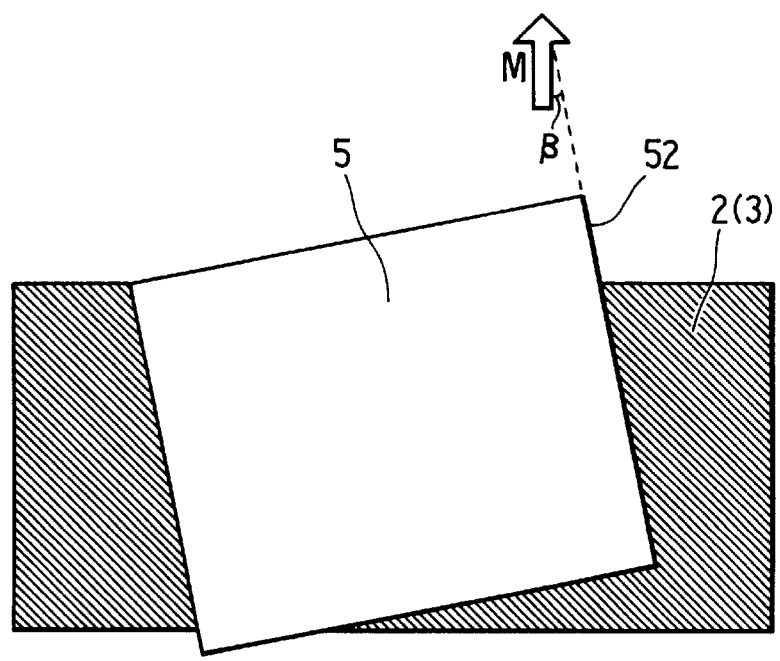
FIG. 8 is a schematic view showing a horizontal angle in the third embodiment.

In this embodiment, the transfer conditions are changed between the transfer of the substrate 5 over the first soldering bath 2 and the second soldering bath 6. The transfer condition to be changed include not only the transfer speed but also an elevation angle a in the upward and downward direction relative to the transfer direction on the horizontal plane, a depth D of dipping in the solder jet, and a horizontal angle β in the horizontal direction relative to the transfer direction. ID that is, as shown in FIG. 7, the elevation angle a in the upward and downward direction relative to the transfer direction (from left to right in FIG. 7) means an angle formed by inclination of the substrate 5 relative to the horizontal plane perpendicular to the vertical direction. The depth D of dipping into the solder jet 21 or 31 means a depth of solder fluid surface 211 or 311 of the solder jet 21 or 31 to the treatment surface 51 of the substrate 5 at the time of dipping the substrate 5. Further, as shown in FIG. 8, the horizontal angle β on the horizontal plane relative to the transfer direction means a horizontal angle formed on the horizontal plane by the side end 52 of the substrate 5 relative to its transfer direction M.

In this embodiment, the elevation angle a of the substrate 5 at the time of transfer over the primary jet soldering bath 2 is set to be smaller than that of the substrate 5 at the time of transfer over the secondary jet soldering bath 3. By increasing the cut height (height of peel back point) H in the secondary jet soldering operation, the solder sticking excessively in the primary jet soldering operation can be reduced. Thus, bridging between the excessively sticking solder can be obviated, resulting in good solder shaping.

Further, the depth D of dipping the substrate 5 in the primary jet soldering bath 2 is set to be larger than that of the substrate 5 at the time of transfer over the secondary jet soldering bath 3. This is because the solder is enabled to enter space deeply as the dipping depth D increases. In the secondary jet soldering operation, the dipping depth D is decreased not to disturb the solder fluid in the secondary jet soldering bath 2, thereby increasing the cut height H.

Further, the horizontal angle β of transferring the substrate 5 over the primary jet soldering bath 2 is set to be smaller than that of transferring the substrate 5 over the secondary jet soldering bath 3. This increased horizontal angle β enables the excessively sticking solder to be cut away from the substrate 5 when the substrate 5 is raised from the secondary jet soldering bath 3, particularly when the substrate 5 is transferred with the elevation angle α.

Each transfer condition is determined so that an area of non-sticking of the solder 6 on the substrate 5 is reduced to a minimum as much as possible over the primary jet soldering bath 2, and so that a cut height H (FIG. 7) of the solder 6 relative to the substrate 5 is reduced to a minimum as much as possible over the secondary jet soldering bath 3.

In practice, the transfer condition which makes the area of non-sticking is to be determined actually by treating a test piece substrate by the use of only the primary jet soldering bath 2. Further, the transfer condition which reduces the cut height H to a minimum is to be determined actually by treating the test piece substrate by the secondary jet soldering bath 3 after treating the test piece substrate by the primary jet soldering bath 2 under the conventional transfer condition.

Figure 9A:
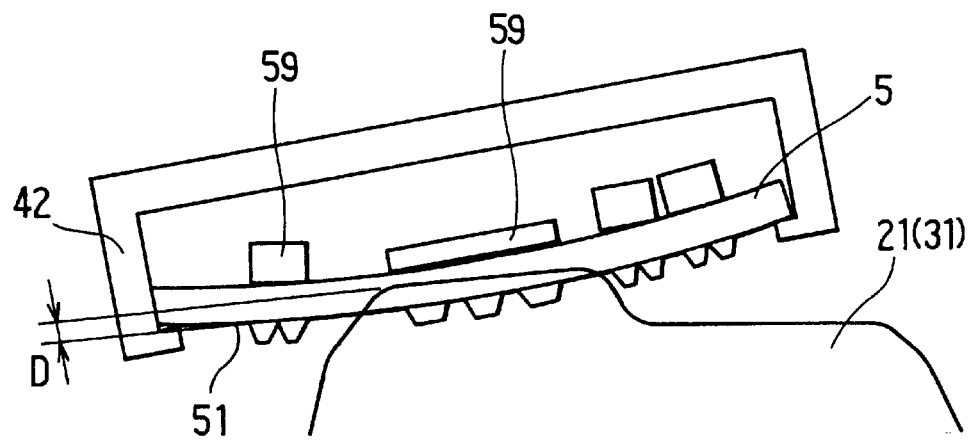
FIGS. 9A and 9B are schematic views showing a dipping depth of solder in a case that a substrate has warping in the third embodiment.
Figure 9B:
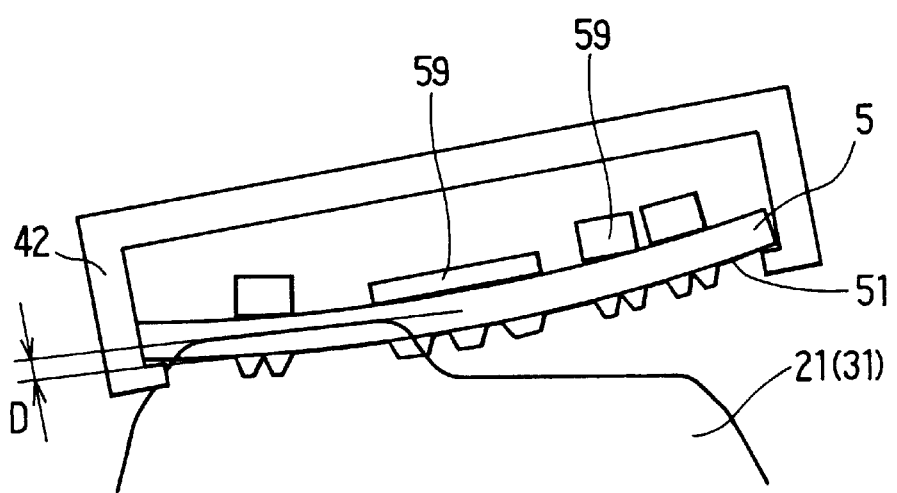

Here, with respect to the dipping depth D of the substrate 5, it is controlled so that the depth D, by which the substrate 5 is immersed in the solder fluid 21 or 31, is maintained constant even when the substrate 5 has a bend as shown in FIGS. 9A and 9B.

In the present embodiment, the solder can easily enter the narrow spaces in the primary jet soldering bath 2, and the soldering can be done easily without causing deformation of the solder sticking to the substrate 5 in the secondary jet soldering bath 3. As a result, the defects of the incomplete soldering are reduced and the jet soldering method, which is free of solder deformation, can be provided.

Figure 10A:
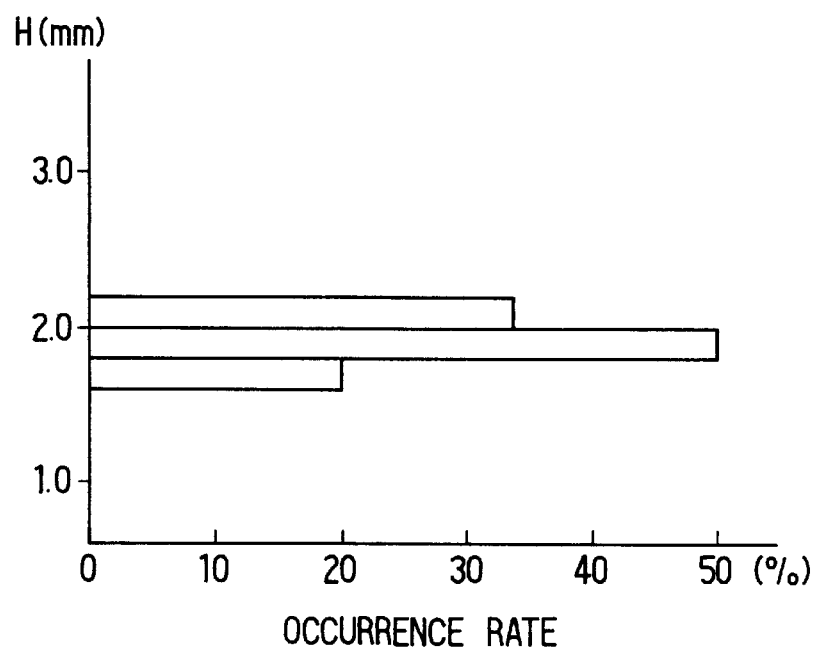
FIGS. 10A and 10B are graphs showing results of measurement of cut height (height of peel back point) of solder in cases that soldering is effected under different conditions.
Figure 10B:
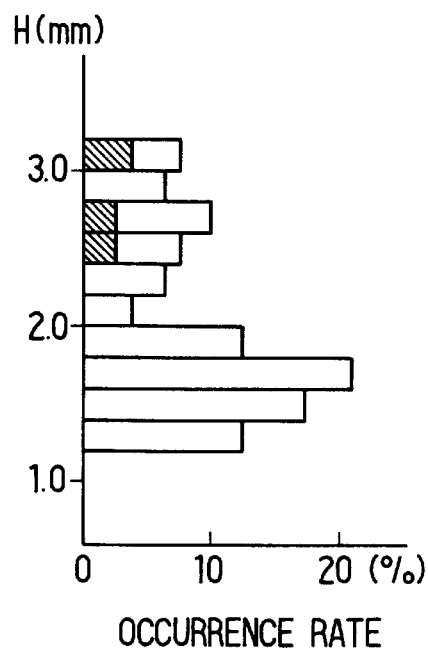

FIG. 10A shows the measured cut height H of the solder 6 relative to the substrate 5, when the soldering is effected under the condition of the third embodiment. That is, the soldering was effected in the secondary jet soldering bath 3 by controlling the transfer speed of the substrate 5 to be 1.4 m/min., the elevation angle a in the upward and downward direction relative to the transfer direction to be 5°, the depth D of dipping into the solder jet to be 0.8 mm, and the horizontal angle β in the horizontal direction relative to the transfer direction to be For comparison purpose, as shown in FIG. 10B, the cut height H of the solder was measured also under the transfer condition different from that in the present embodiment. That is, the transfer speed of the substrate over the secondary soldering bath is 1.8 m/min., the elevation angle is 5°, and the dipping depth D is not controlled.

As understood from those figures, the cut height H of the solder varies less under the condition of the present embodiment (FIG. 10A), while the cut height H of the solder varies greatly (FIG. 10B).

The hatching in FIG. 10B indicates shorting between electrode terminals of the circuit parts on the substrate. That is, it is understood that the shorting occurred between the terminals in the case that the cut height H was about 2.5 mm or more. It is to be understood from the above that the present embodiment is effective to prevent occurrence of the shorting between terminals which is caused by large cut height of the solder.

(Fourth Embodiment)

In this embodiment, the substrate 5 is transferred over the primary jet soldering bath 2 while being vibrated. That is, the hand 41 of the actuator 4 holding the substrate 5 is vibrated inch by inch, only when the treatment surface 51 of the substrate 5 is immersed in the primary solder jet 21 at above the primary jet soldering bath 2. Thus, the solder 6 is enabled to enter the narrow spaces 57 on the treatment surface 51 of the substrate 5. The same or similar transfer conditions as in the foregoing embodiments may also be applied in this embodiment.

(Fifth Embodiment)

Figure 11:
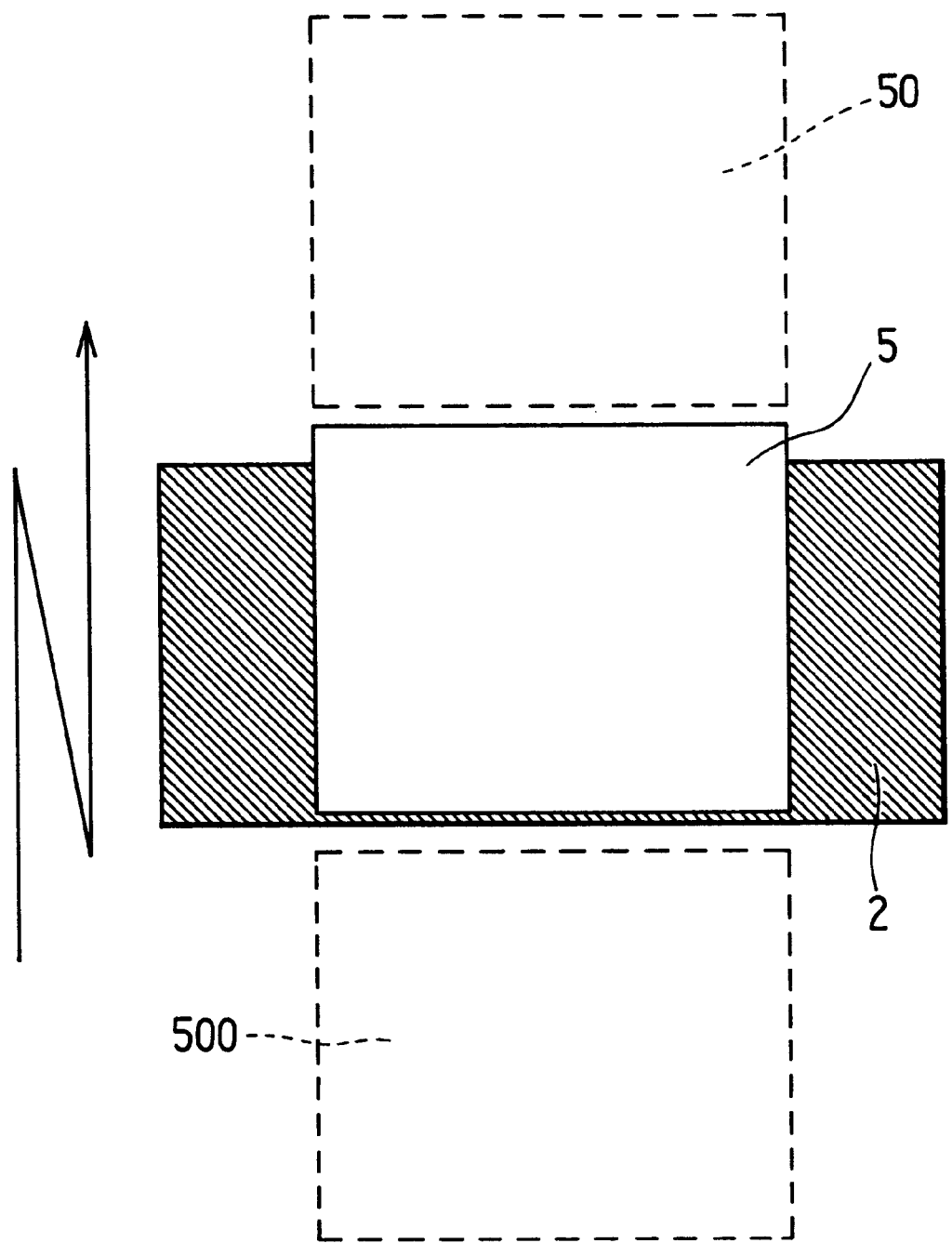
FIG. 11 is a schematic plan view showing a jet soldering operation according to a fifth embodiment of the present invention.

In this embodiment, as shown in FIG. 11, the substrate 5 is transferred by one return further over the primary jet soldering bath 2 after being transferred over the primary jet soldering bath 2 once. That is, the substrate 5 is transferred over the primary jet soldering bath 2 until the substrate 5 moves out of the primary soldering bath 2 to the position indicated by numeral 50 in FIG. 11, while being immersed in the primary solder jet 21. Next, the substrate 5 is transferred back until the substrate 5 moves out of the bath 2 to the position indicated by numeral 500 in FIG. 11, while being immersed in the primary solder jet 21. Thereafter, the substrate 5 is advanced further 15. to be transferred to the secondary jet soldering bath 3, while being immersed in the primary solder jet 21 at above the primary jet soldering bath 2. Thus, the substrate 5 can be transferred to the secondary jet soldering bath 3, under the condition that the non-sticking part of the solder is minimized.

Here, when necessary, the above operation may be repeated twice or more, so that the substrate 5 may be transferred over the primary jet soldering bath 2 twice or more. Further, the same or similar transfer conditions as in the foregoing embodiments may also be applied in this embodiment.

(Sixth Embodiment)

Figure 12:
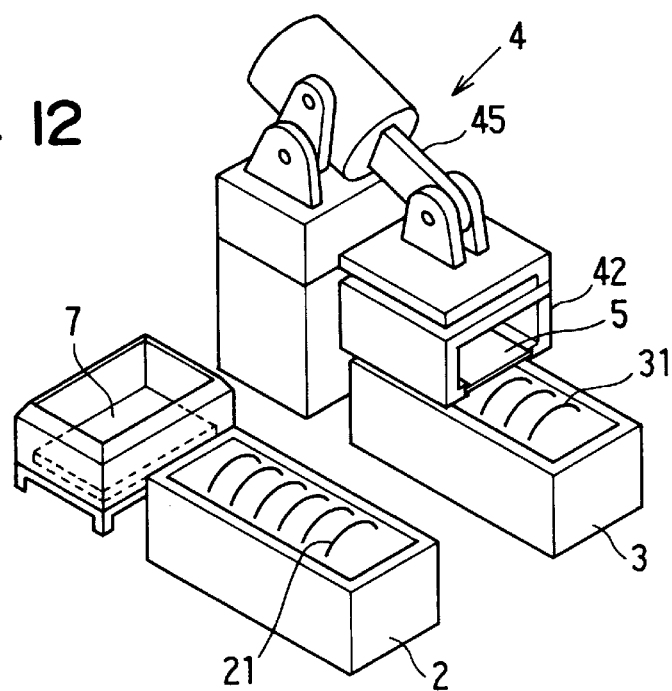
FIG. 12 is a perspective view showing a jet soldering apparatus according to a sixth embodiment of the present invention.

In this embodiment, as shown in FIG. 12, the actuator 4 has the arm 45, and the chuck mechanism 42 is provided at the free top end of the arm 45 so that the chuck mechanism 42 is capable of gripping the substrate 5. The arm 45 transfers the chuck mechanism 42 to a desired position in a desired direction by way of rotation, expansion/contraction and the like motion through joints and the like. This arm 45 functions as a transfer mechanism for the chuck mechanism 42 for the substrate 5.

A pre-heater 7 is arranged on the floor around the actuator 4 in addition to the primary jet soldering bath 2 and the secondary jet soldering bath 3. Melted solder 6 is jetted in an upward direction in each of the primary jet soldering bath 2 and the secondary jet soldering bath 3.

Figure 13:
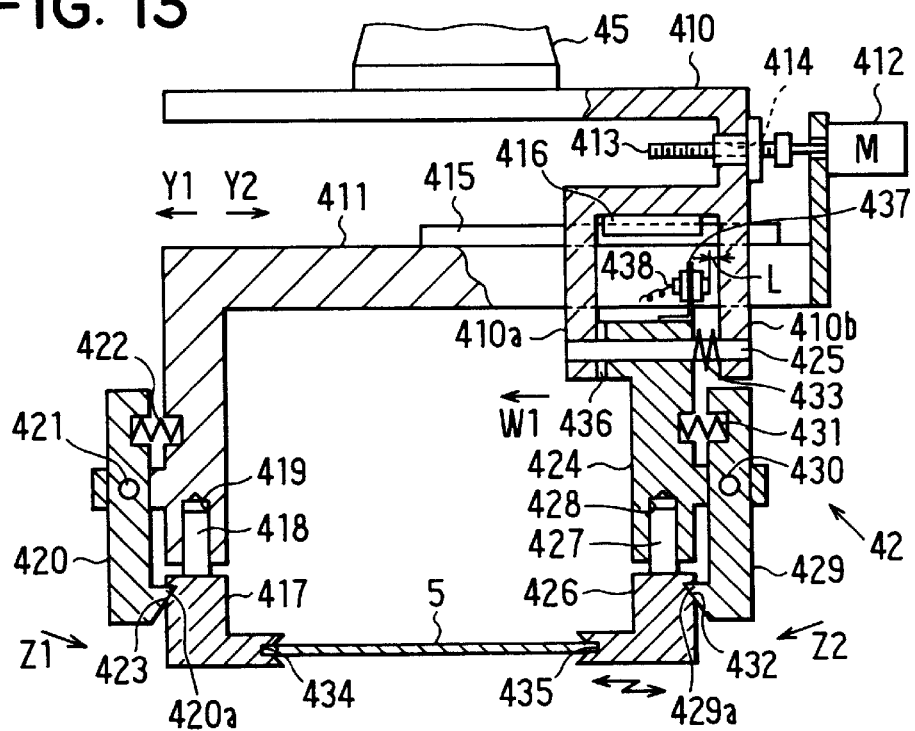
FIG. 13 is a vertical sectional view showing a chuck mechanism of an actuator used in the sixth embodiment.

The chuck mechanism 42 provided at the top end of the arm 45 is shown in FIG. 13. The chuck mechanism 42 has a first nail 417 and a second nail 426, which are driven by a motor 412 as a chuck actuator to approach to and leave from each other. Thus, the substrate 5 is held by approaching of the nails 417 and 426, and is released by leaving of the nails 417 and 426. That is, the first nail 417 holds one side edge of the rectangular shape of the substrate 5, and the second nail 426 holds another side edge which is opposite to the side edge held by the first nail 417.

More specifically, a main frame 410 is attached to the arm 45. The main frame 410 has parallel plate parts 410a and 410b by which a frame 411 for the first nail 417 is supported slidably. The motor 412 for opening and closing the chuck nails 417 and 426 is fixed to the frame 411 for the first nail 417. A feeder thread 413 is fixed to the output shaft of the motor 412, and the feeder thread 413 is thread-fitted in a threaded hole 414 formed in the main frame 410. The frame 411 for the first nail 417 is movable in a Y1 direction in the figure by a forward rotation of the output shaft of the motor 412, while it is movable in a Y2 direction in the figure by a reverse rotation of the output shaft of the motor 412. AC servo motor may be used as the motor 412. The frame 411 has a guide rail 415, and the main frame 410 has a guide block 416. Thus, the frame 411 is movable while being guided by the guide rail 415 and the guide block 416.

The first nail 417 is supported detachably at the end of the frame 411. Specifically, a guide pin 418 is provided on the first nail 417, and the guide pin 418 is fitted into a guide hole 419 formed on the bottom end of the frame 411. A hook 420 is supported rotatably by a shaft 421 at the bottom end of the frame 411, and biased by a spring 422 in the Z1 direction in the figure.

The first nail 417 is restricted from disengaging from the frame 411 as long as a nail 420a of the hook 420 is fitted into a recess 423 formed on a side face of the first nail 417.

A frame 422 is provided between the parallel plate parts 410a and 410b of the main frame 410. The frame 422 is supported movably in the horizontal direction by a shaft 425 bridging the parallel plate parts 410a and 410b. The second nail 426 is supported detachably at the bottom end of the frame 422. Specifically, a guide pin 427 is provided on the second nail 426, and the guide pin 427 is fitted into a guide hole 428 formed on the bottom end of the frame 422. A hook 429 is supported rotatably by a shaft 430 at the end of the frame 422, and is biased by a spring 431 in the Z2 direction in the figure. The second nail 426 is restricted from being disengaging from the frame 422 as long as a nail 429a of the hook 429 is fitted into a recess 432 formed on the side face of the second nail 426.

Further, a spring 433 is disposed between the parallel plate part 410b and the frame 422, between the parallel plate parts 410a and 410b of the main frame 410. The frame 422 is biased by the spring 433 in the W1 direction in the figure.

The first nail 417 is formed in an L-shape in cross section, and is formed with a recess 434 at the free end thereof. Similarly, the second nail 426 is formed in an L-shape in cross section, and is formed with a recess 435 at the free end thereof to face the recess 434 of the first nail 417. Thus, the first nail 417 and the second nail 426 are constructed to be capable of sandwiching the substrate 5 between the recesses 434 and 435.

A space 436 is provided between the frame 422 and the parallel plate part 410a of the main frame 411 under the condition that the substrate 5 is sandwiched between the recess 434 of the first nail 417 and the recess 435 of the second nail 426. An L-shaped attachment member 437 is fixed to the upper surface of the frame 422, and a distance sensor 438 is attached to the attachment member 437. The distance sensor 438 measures a distance L from the sensor 438 to the parallel plate part 410b of the main frame. This distance L corresponds to a distance of the space 436. Thus, this results in measurement of the space 436 which is provided when the substrate 5 is sandwiched by the nails 417 and 426. In this instance, the measured distance L becomes less than a predetermined value (threshold value), because the space 436 is widened when a foreign object is pinched between the recesses 434 and 435 of the nails 417 and 426. If this pinching of the foreign object is detected, the operation is stopped and an alarm is issued.

Figure 14A:
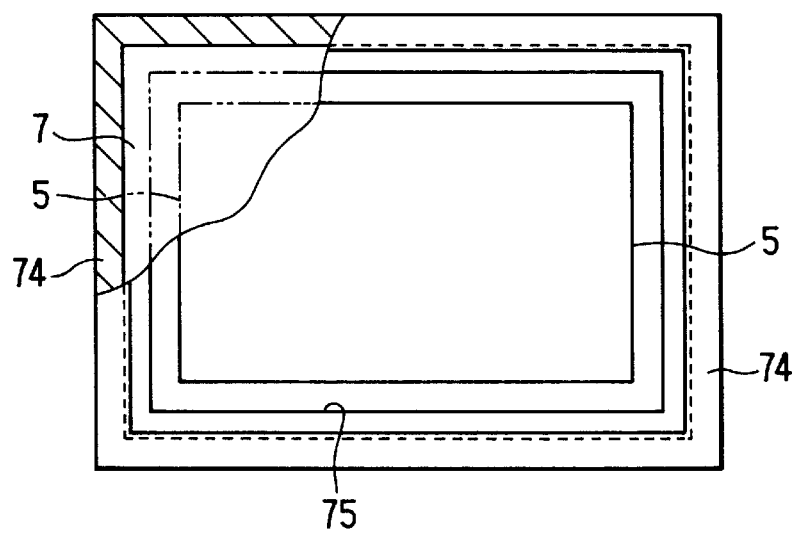
FIGS. 14A and 14B are a plan view and a sectional view showing a pre-heater used in the sixth embodiment, respectively.
Figure 14B:
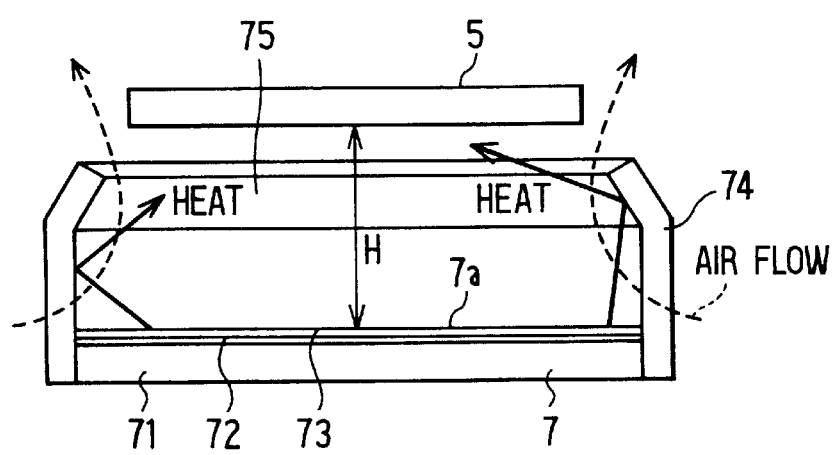

As shown in FIGS. 14A and 14B, the pre-heater 7 uses a far-infrared type panel heater. The pre-heater 7 has a heat radiation surface 7a on its top. The pre-heater 7 is sized to 300 mm×400 mm in longitudinal and lateral directions. The far-infrared type panel heater (pre-heater) 5 has a stack of three layers, which comprise a base plate 71 at the bottom, an electric heater wire 72 and a heat diffuser plate 73. The base plate 71 is shaped in a rectangle and has a predetermined thickness. The heat diffuser plate 73 covers an entirety of the base plate 71 including the electric heater wire 73.

Figure 15A:
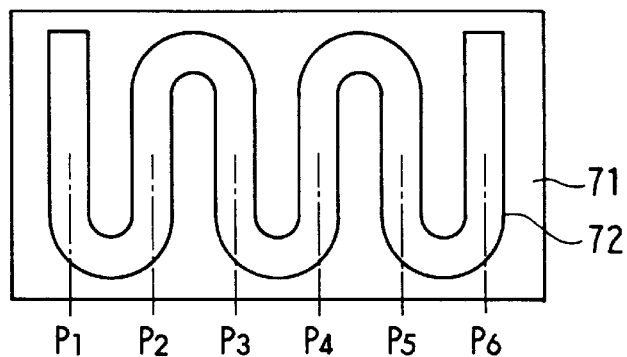
FIGS. 15A and 15B are a plan view and a graph showing the pre-heater and its temperature distribution in the sixth embodiment, respectively.
Figure 15B:
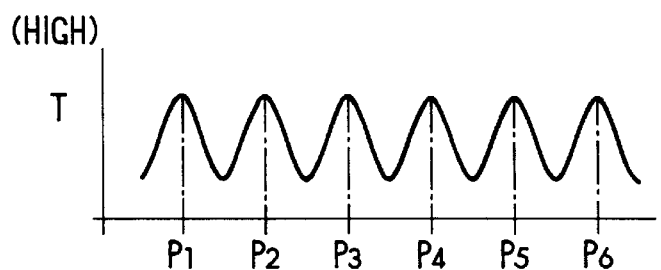

As shown in FIG. 15A, the electric heater wire 72 is extended to meander on the top surface of the base plate 71. This pre-heater 7 radiates far-infrared beams from the surface of the heat diffuser plate 73 when the electric heater wire 72 is energized. Here, as shown in FIG. 15B, the temperature distribution becomes non-uniform or irregular because of the electric heater wire 72 arranged to meander in the surface of the pre-heater 7. That is, the temperature T is high where the electric heater wire 72 is provided (P1–P6), while it is low where the electric heater wire 72 is not provided.

In this embodiment, as shown in FIGS. 14A and 14B, a shield plate 74 is raised upright as a shield member to surround all four sides of the pre-heater 7 shaped in a rectangular plate.

The shield plate 74 is raised higher than the heat radiation surface 7a of the pre-heater 7, and attached tightly to the sides of the pre-heater 7. The upper end part of the shield plate 74 is bent inwardly, while providing an opening 75 at above the central part of the pre-heater 7. When the substrate 5 is positioned on the upper end opening 75 of the shield plate 74, the substrate 5 is heated. The heat is not only radiated from the heat radiation surface 7a of the pre-heater 7 to be supplied directly to the substrate 5, but also reflected at the inside surface of the shield plate 74 to be supplied to the substrate 5.

In operation of the jet soldering apparatus constructed as above, the actuator 4 transfers the chuck mechanism 42 provided at the free end of the arm 45 to a tentative location of the substrate 5, and grips the substrate 5 by the nails 417 and 426 driven by the motor 412 of the chuck mechanism 42 shown in FIG. 13. The substrate 5 is mounted with the electronic circuit parts, and is an article in which electrodes and the like are subjected to soldering.

The substrate 5 is transferred to a position above the pre-heater 7 shown in FIG. 12 by operation of the arm 45, and is loaded on the upper opening 75 of the shield plate 74 of the pre-heater 7. This loaded condition is maintained for a predetermined time period. That is, it is held for the predetermined time period on the opening 75 of the shield plate 74 at an elevated position. If no shield plate is provided, cooling wind flows over the heat radiation surface 7a of the pre-heater 7 and cools down the heat radiation surface 7a of the pre-heater 7. Thus, pre-heating efficiency is lessened. However, as the shield plate 74 restricts generation or flow of the cooling wind, the heat radiation surface 7a of the pre-heater 7 is restricted from being cooled down. As a result, not only the surface temperature in the face of the heat radiation surface 7a is restricted from decreasing, but also the heating of the substrate 5 is effected efficiently.

Further, as the substrate 5 is held stationary above the pre-heater 7 and heated at the fixed position while equalizing the temperature distribution in the surface of the substrate 5, the pre-heater 7 can be a small-sized type. In addition, heating temperature, heating position (distance from the heat radiation surface 7a to the substrate 5) and heating period of time are managed as the pre-heating condition so that most appropriate heating condition can be applied to each type of substrates. By thus increasing the freedom of heating condition management, the pre-heating can be effected under the most appropriate condition to equalize the pre-heated temperature even in case that substrates differ in size and electronic circuit parts to be mounted differ. In one example of the condition to be managed, the heating temperature is of 100° C., the height h as the heating position is 20–50 mm, and the heating period is 20–40 seconds.

After thus pre-heating the substrate 5, the substrate 5 is subjected to the jet soldering in the same manner as in the foregoing embodiments. That is, the substrate 5 is immersed in the solder jet 21 in the primary jet soldering bath 2 by operation of the arm 45. The solder stick to the treatment surface of the substrate 5 by transferring the substrate 5 over the primary jet soldering bath 2 while contacting the treatment surface of the substrate 5 with the primary solder jet 21.

Then, the substrate 5 is immersed in the solder jet 31 in the secondary jet soldering bath 3 by operation of the arm 45. The solder sticking to the substrate 5 is shaped by transferring the substrate 5 over the secondary jet soldering bath 3 while contacting the treatment surface of the substrate 5 with the secondary solder jet 31.

Here, if the temperature in the substrate 5 differs depending on size of the substrate 5 and the circuit parts mounted on the substrate 5, the temperature changes from substrate to substrate and the irregularity of temperature distribution occurs. However, according to the present embodiment, the heat radiation surface 7a of the pre-heater 7 is surrounded by the shield plate 74 so that it is not influenced by the air flow, and the substrate 5 is transferred by the arm 45. Thus, it becomes possible with freedom to stop the substrate 5 at above the pre-heater 7, and to variably set the height from the pre-heater 7 to the substrate 5, the pre-heating time period and the like at the time of determining the pre-heating condition. Therefore, the pre-heating temperature can be made constant for substrates differing from each other in size or the like by changing the condition from substrate to substrate.

As described above, irregularity of the substrate temperature and temperature difference among the substrates can be reduced to improve the quality of soldering, by using the arm 45 as the transfer means of the substrate 5, stopping the substrate 5 at above the pre-heater 7, and managing the pre-heating condition such as pre-heating temperature, pre-heating position, pre-heating period of time or the like. For instance, it is possible to change the amount of heating by adjustment of the distance between the heat radiation surface 5a of the pre-heater 7 and the substrate 5 or adjust the time period of maintaining the substrate 5 at above the heat radiation surface 7a of the pre-heater 7.

Further, the pre-heater 7 can be reduced in size and the entire apparatus can be reduced in size by holding the substrate 5 at above the pre-heater 7. That is, although it is necessary to use the lengthy pre-heater 63 in the conventional method, the pre-heater 7 can be reduced in size because it is only necessary to arrange the heat radiation surface below the substrate 5 at the time of stopping the substrate 5. Specifically, the heat radiation surface 7a of the pre-heater 7 may be reduced to one quarter compared with the conventional one.

As described fully above, the shield plate 74 is provided around the heat radiation surface 7a of the pre-heater 7 to be higher than the heat radiation surface 7a, the substrate 5 mounted with the circuit parts thereon is arranged above the heat radiation surface 7a of the pre-heater 7, and the substrate 5 is contacted to the solder jet after holding the above position for the predetermined time period. As a result, the pre-heating before dipping the substrate 5 in the solder jet can be stabilized, and the apparatus can be reduced in size.

(Seventh Embodiment)

Figure 16A:
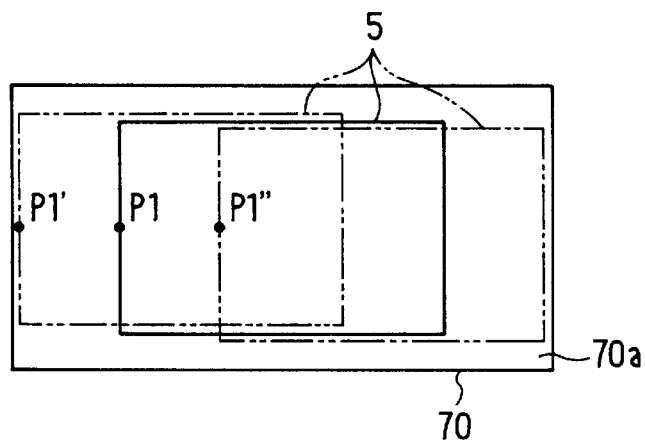
FIGS. 16A and 16B are a plan view and a side view showing a movement of a substrate over a pre-heater in a seventh embodiment of the present invention.
Figure 16B:
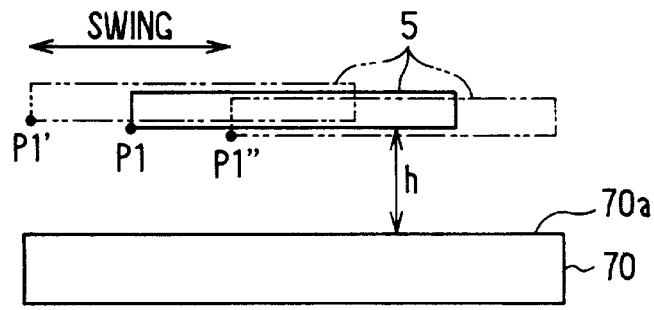

In this embodiment, the shield plate shown in FIGS. 14A and 14B is not provided. Instead, as shown in FIGS. 16A and 16B, the substrate 5 is swung in the horizontal direction above a pre-heater 70 at a predetermined moving speed by operation of the arm 45. The substrate 5 is immersed in the solder jet in the first and the second jet soldering baths 2 and 3 after maintaining the swinging for a predetermined time period. With respect to the swinging of the substrate 5, as indicated by locus P1, P1' and P1" in the figures, the substrate 5 is swung in the horizontal direction at the predetermined height h above the heat radiation surface 70a of the pre-heater 70.

Figure 17A:
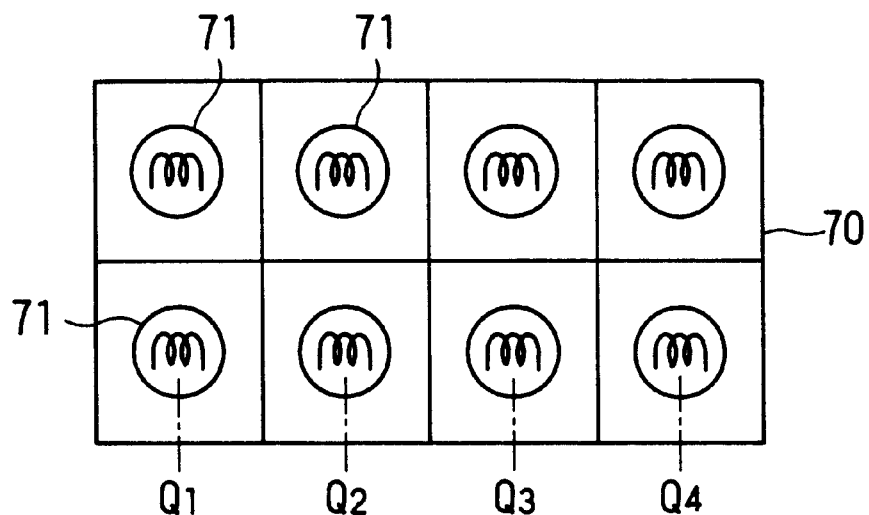
FIGS. 17A and 17B are a plan view and a graph showing the pre-heater and its temperature distribution in the seventh embodiment, respectively.
Figure 17B:
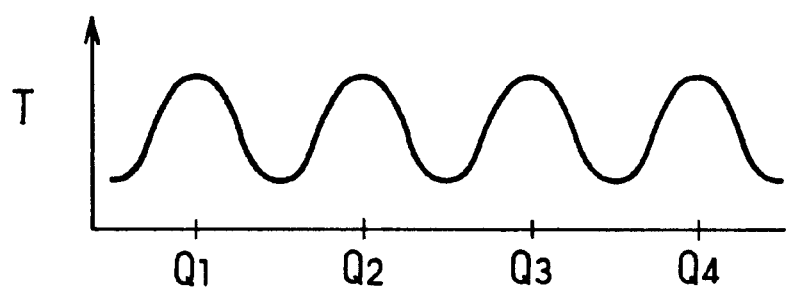
Figure 18:
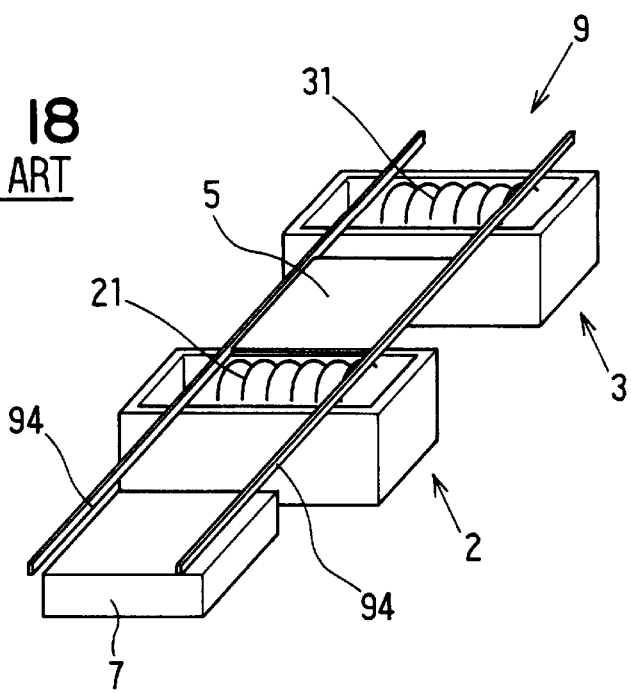
FIG. 18 is a perspective view showing a conventional jet soldering apparatus.
Figure 19A:
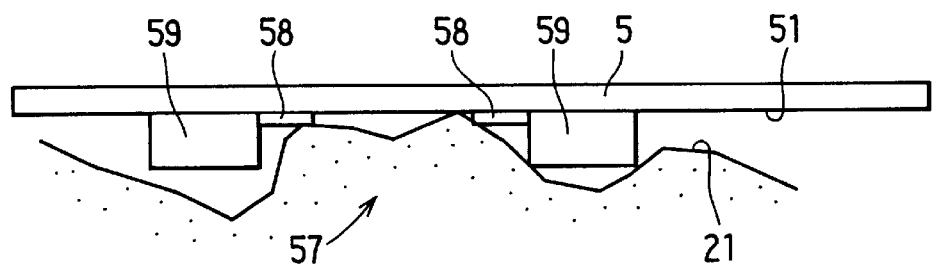
FIGS. 19A and 19B are schematic side views showing primary soldering operation in cases that space among electronic circuit parts on a substrate is comparatively large and comparatively small, respectively.
Figure 19B:
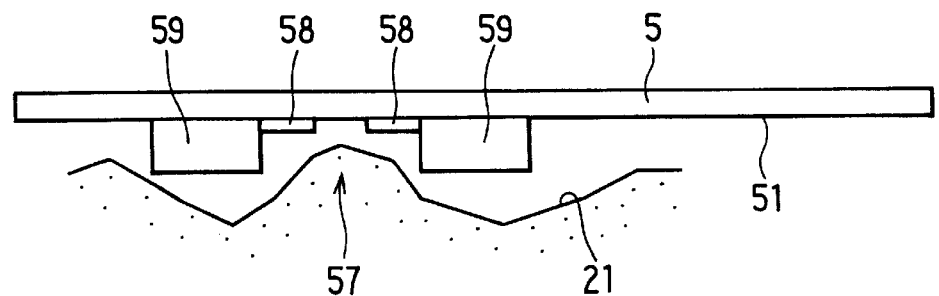

Here, as shown in FIG. 17A, the pre-heater 70 uses a lamp heater, which is an infrared type and uses a number of aligned lamp elements 71. In this instance, the temperature distribution is not uniform in the surface of the pre-heater 70. That is, as shown in FIG. 17B, the temperature T is high where the lamp elements 71 are provided (Q1–Q4), but low where the lamp elements 71 are not provided. However, the temperature distribution is uniformed in the surface of the substrate 5 by swinging the substrate 5 in the horizontal direction for the predetermined time period at above the pre-heater 70. Alternatively, the pre-heater 70 may be swung.

According to this embodiment, the substrate 5 mounted with the circuit parts thereon is positioned above the heat radiation surface 70a of the pre-heater 70, and is swung in the horizontal direction for the predetermined time period, and then is contacted to the solder jet. Therefore, the irregularity of the temperature in the surface of the substrate 5 can be restricted, and the substrate 5 can be heated in a manner to equalize the temperature distribution in the surface of the substrate 5, resulting in the reduction in size of the apparatus. It is possible to set the pre-heating condition by the distance h from the heat radiation surface 70a of the pre-heater 70 to the substrate 5, the time period of pre-heating or the like, so that the pre-heating temperature is equalized with greater freedom of setting the condition. Thus, the pre-heating before contacting with the solder jet can be stabilized, and the apparatus can be reduced in size.

Here, the sixth embodiment and the seventh embodiment may be combined. That is, not only the shield plate 74 higher than the heat radiation surface is provided around the heat radiation surface of the pre-heater, but also the substrate 5 mounted with the circuit parts is swung in the horizontal direction for the predetermined time period while positioning the substrate 5 above the heat radiation surface of the pre-heater. The temperature distribution in the substrate is equalized further by this combination.

The present invention should not be limited to the foregoing embodiments, but may be implemented in many other ways without departing from the spirit of the invention.

What is claimed is:

1. A jet soldering method comprising the steps of:

sticking solder onto a treatment surface of a substrate, while holding and transferring the substrate over a primary jet soldering bath by an actuator with the treatment surface of the substrate being immersed in a primary solder jet; and shaping the solder sticking to the substrate, while transferring the substrate over a secondary jet soldering bath with the treatment surface of the substrate being immersed in a secondary solder jet, wherein a transfer condition between a transfer of the substrate over the primary jet soldering bath and a transfer over the secondary jet soldering bath is differentiated by the actuator between the primary jet soldering bath and the secondary jet soldering bath.

2. A jet soldering method as in claim 1, wherein:

the transfer condition of the substrate includes at least one of a transfer speed, an elevation angle in upward and downward directions relative to a transfer direction, dipping depth into solder jet, and horizontal angle in a horizontal direction relative to the transfer direction.

3. A jet soldering method as in claim 1, wherein:

the actuator includes a chuck mechanism which grips the substrate to transfer the substrate.

4. A jet soldering method as in claim 2, wherein:

the substrate is transferred over the primary jet soldering bath at a fixed high speed; and the substrate is transferred over the secondary jet soldering bath at a speed lower than the transfer speed over the primary jet soldering bath.

5. A jet soldering method as in claim 2, wherein:

the elevation angle of transferring the substrate over the primary jet soldering bath is smaller than that of transferring the substrate over the secondary jet soldering bath.

6. A jet soldering method as in claim 5, wherein:

the horizontal angle of the substrate at the time of transferring over the primary jet soldering bath is smaller than that of the substrate at the time of transferring over the secondary jet soldering bath.

7. A jet soldering method as in claim 2, wherein:

the dipping depth of the substrate at the time of transferring over the primary jet soldering bath is larger than that of the substrate at the time of transferring over the secondary jet soldering bath.

8. A jet soldering method as in claim 2, wherein:

the horizontal angle of the substrate at the time of transferring over the primary jet soldering bath is smaller than that of the substrate at the time of transferring over the secondary jet soldering bath.

9. A jet soldering method comprising the steps of:

sticking solder onto a treatment surface of a substrate, while holding and transferring the substrate over a primary jet soldering bath by an actuator with the treatment surface of the substrate being immersed in a primary solder jet; and shaping the solder sticking to the substrate, while transferring the substrate over a secondary jet soldering bath with the treatment surface of the substrate being immersed in a secondary solder jet, wherein a transfer condition between a transfer of the substrate over the primary jet soldering bath and a transfer over the secondary jet soldering bath is differentiated from each other, wherein, the treatment surface of the surface is immersed from four different directions relative to the primary solder jet.

10. A jet soldering method comprising the steps of:

sticking solder onto a treatment surface of a substrate, while holding and transferring the substrate over a primary jet soldering bath by an actuator with the treatment surface of the substrate being immersed in a primary solder jet; and shaping the solder sticking to the substrate, while transferring the substrate over a secondary jet soldering bath with the treatment surface of the substrate being immersed in a secondary solder jet, wherein a transfer condition between a transfer of the substrate over the primary jet soldering bath and a transfer over the secondary jet soldering bath is differentiated from each other, wherein, the actuator includes a robot which is capable of rotating and transferring the substrate in arbitrary directions.

11. A jet soldering method as in claim 1, wherein:

the substrate is transferred over the primary jet soldering bath while being vibrated.

12. A jet soldering method as in claim 1, wherein:

the substrate is transferred over the primary jet soldering bath more than one round transfer after being transferred over the primary jet solder.

13. A jet soldering method as in claim 1, wherein:

the transfer condition of the substrate is determined so that an area of non-sticking of the solder on the substrate is reduced to a minimum over the primary jet soldering bath, and so that a cut height of the solder relative to the substrate is reduced to a minimum over the secondary jet soldering bath.

14. A jet soldering apparatus comprising:

a primary jet soldering bath for sticking solder onto a treatment surface of a substrate;

a secondary jet soldering bath for shaping the solder sticking onto the substrate; and an actuator for transferring the substrate over the primary jet soldering bath and the secondary jet soldering bath while dipping the treatment surface in a primary solder jet and a secondary solder jet, wherein the actuator is capable of transferring the substrate at a different transfer condition between a transfer over the primary jet soldering bath and a transfer over the secondary jet soldering bath.

15. A jet soldering apparatus as in claim 14, wherein:

the transfer condition of the substrate includes at least one of a transfer speed, an elevation angle in upward and downward directions relative to a transfer direction, dipping depth into solder jet, and horizontal angle in a horizontal direction relative to the transfer direction.

16. A jet soldering apparatus as in claim 14, wherein:

the actuator includes a chuck mechanism which grips the substrate.

17. A jet soldering apparatus as in claim 14, wherein:

the actuator includes a robot which is capable of rotating and transferring the substrate in arbitrary directions.

18. A jet soldering apparatus comprising:

a pre-heater for pre-heating a substrate mounted with electronic circuit parts, the pre-heater having a heat radiation surface formed on an upper surface thereof;

a shield member provided around the heat radiation surface of the pre-heater to be higher than the heat radiation surface;

a jet soldering bath for soldering the electronic circuit parts to the substrate; and an actuator for moving the substrate to be positioned above the heat radiation surface of the pre-heater, and moving the substrate to the jet soldering bath to be immersed in a solder jet after holding the position of the substrate above the pre-heater for a predetermined time period.

19. A jet soldering apparatus comprising:

a pre-heater for pre-heating a substrate mounted with electronic circuit parts, the pre-heater having a heat radiation surface formed on an upper surface thereof;

a jet soldering bath for soldering the electronic circuit parts to the substrate; and an actuator for moving the substrate to be positioned above the heat radiation surface of the pre-heater, and moving the substrate to the jet soldering bath to be immersed in a solder jet after swinging the substrate above the pre-heater for a predetermined time period.

20. A jet soldering apparatus as in claim 18, wherein:

an amount of heating is changed by adjusting a distance between the heat radiation surface of the pre-heater and the substrate.

21. A jet soldering apparatus as in claim 18, wherein:

an amount of heating is changed by adjusting a period of time in which the substrate is held above the heat radiation surface of the pre-heater.

22. A jet soldering apparatus as in claim 18, wherein:

the actuator includes a chuck mechanism provided f or gripping the substrate, and an arm provided to transfer the chuck mechanism so that the substrate is transferred.

23. A jet soldering method comprising the steps of:

pre-heating a substrate for a predetermined time period by a pre-heater to equalize temperature distribution in the substrate;

sticking solder onto a treatment surface of the substrate, while transferring the substrate over a primary jet soldering bath with the treatment surface of the substrate being immersed in a primary solder jet; and shaping the solder sticking to the substrate, while transferring the substrate over a secondary jet soldering bath with the treatment surface of the substrate being immersed in a secondary solder jet, wherein a transfer condition between a transfer of the substrate over the primary jet soldering bath and a transfer over the secondary jet soldering bath is differentiated from each other, the transfer condition of the substrate includes at least one of a transfer speed of the substrate, an elevation angle of inclination of the substrate in upward and downward directions relative to a transfer direction of the substrate, dipping depth of the substrate into solder jet, and a horizontal angle of inclination of the substrate in a horizontal plane relative to the transfer direction.

24. A jet soldering method as in claim 23, wherein:

the transfer speed of the substrate over the primary jet soldering bath is higher than that of the substrate over the secondary jet soldering bath.

25. A jet soldering method as in claim 23, wherein:

the substrate is transferred over the primary jet soldering bath and over the secondary jet soldering bath, wherein the substrate is transferred at a higher transfer speed over the primary jet soldering bath than the secondary jet soldering bath.

26. A jet soldering method as in claim 23, wherein:

the elevation angle of the substrate over the primary jet soldering bath is smaller than that of the substrate over the secondary jet soldering bath.

27. A jet soldering method as in claim 23, wherein:

the dipping depth of the substrate in the primary solder jet is larger than that in the secondary solder jet.

28. A jet soldering method as in claim 23, wherein:

the horizontal angle of the substrate in the primary jet soldering bath is smaller than that of the substrate in the secondary jet soldering bath.

29. A jet soldering method as in claim 23, wherein:

the pre-heating step includes the step of shielding radiated heat by a shield plate raised upwardly to surround side ends of the pre-heater.

30. A jet soldering method as in claim 23, wherein:

the pre-heating step includes the step of causing a relative movement between the pre-heater and the substrate reciprocally above the pre-heater.

* * * * *